(12) United States Patent
Kamata et al.

(10) Patent No.: US 7,232,621 B2
(45) Date of Patent: *Jun. 19, 2007

(54) METHOD OF PATTERNING MAGNETIC PRODUCTS USING CHEMICAL REACTION

(75) Inventors: Yoshiyuki Kamata, Tokyo (JP); Katsuyuki Naito, Tokyo (JP); Hiroyuki Hieda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

This patent is subject to a terminal disclaimer.

(21) Appl. No.: 10/885,028

(22) Filed: Jul. 7, 2004

(65) Prior Publication Data

US 2004/0258833 A1  Dec. 23, 2004

Related U.S. Application Data

(63) Continuation of application No. 10/108,431, filed on Mar. 29, 2002, now Pat. No. 6,841,224.

(30) Foreign Application Priority Data

Mar. 30, 2001  (JP)  ............................. 2001-102215
Dec. 28, 2001  (JP)  ............................. 2001-399848

(51) Int. Cl.
G11B 5/65 (2006.01)
(52) U.S. Cl. ..................................... 428/836
(58) Field of Classification Search .................. None
See application file for complete search history.

(56) References Cited

U.S. PATENT DOCUMENTS 5,091,225 A  2/1992  Goto
5,820,769 A  10/1998  Chou
5,998,040 A  12/1999  Nakatani et al.
6,045,925 A  4/2000  Klabunde et al.

(Continued)

FOREIGN PATENT DOCUMENTS

JP  05-205257  8/1993

(Continued)

OTHER PUBLICATIONS

S. E. Lambert et al, IEEE Transactions on Magnetics, Vol. 25, No. 5, pp. 3381-3383, "Reduction of Edge Noise in Thin Film Metal Media Using Discrete Tracks", Sep. 1989.

Primary Examiner—Kevin M. Bernatz
(74) Attorney, Agent, or Firm—Oblon, Spivak, McClelland, Maier & Neustadt, P.C.

(57) ABSTRACT

A method of patterning magnetic material includes forming a ferromagnetic material layer containing one element selected from the group consisting of Fe, Co and Ni on a substrate, selectively masking a surface of the ferromagnetic material layer, and making nonferromagnetic. The making nonferromagnetic step includes exposing an exposed portion in halogen-containing reaction gas, changing magnetism of the exposed portion and a lower layer thereof by chemical reaction, and making the exposed portion a nonferromagnetic material region. A magnetic recording medium is fabricated by using the magnetic material patterning method and includes a plurality of recording regions made of ferromagnetic materials, each containing at least one element selected from the group consisting of Fe, Co and Ni, and a nonferromagnetic material region for separating the recording regions from each other. The nonferromagnetic material region is a compound region of the ferromagnetic material and halogen.

7 Claims, 11 Drawing Sheets

U.S. PATENT DOCUMENTS

| | | |
|---|---|---|
| 6,125,095 A | 9/2000 | Gemma et al. |
| 6,168,845 B1 | 1/2001 | Fontana et al. |
| 6,197,399 B1 | 3/2001 | Naito et al. |
| 6,303,277 B1 | 10/2001 | Hieda et al. |
| 6,383,597 B1 | 5/2002 | Fullerton et al. |
| 6,387,530 B1 | 5/2002 | Liu et al. |
| 6,841,224 B2 * | 1/2005 | Kamata et al. .......... 428/836.3 |
| 2004/0191557 A1 | 9/2004 | Kamata et al. |

FOREIGN PATENT DOCUMENTS

| | | |
|---|---|---|
| JP | 06-333230 | 2/1994 |
| JP | 2000-195200 | 7/2000 |
| JP | 2001-134937 | 5/2001 |

* cited by examiner

METHOD OF PATTERNING MAGNETIC PRODUCTS USING CHEMICAL REACTION

CROSS REFERENCE TO RELATED APPLICATION

This application is a continuation application of U.S. application Ser. No. 10/108,431 filed on Mar. 29, 2002, now U.S. Pat. No. 6,841,224, which is based upon and claims the benefit of priority from the prior Japanese Patent Applications No. 2001-102215 filed on Mar. 30, 2001 and No. 2001-399848 filed on Dec. 28, 2001, the entire contents of which are incorporated herein by reference.

BACKGROUND OF THE INVENTION

1. Field of the Invention

The present invention relates to a high-density magnetic recording technology and, more particularly, to a method of patterning magnetic products, magnetic recording media such as patterned media produced by this method, and other magnetic products, and to a magnetic recording apparatus equipped with such magnetic recording media.

2. Description of the Related Art

In recent years, because of an increase in a surface recording density of a magnetic recording medium along with an increased recording capacity of a hard disk drive (referred to as HDD, hereinafter), each recording bit size on the magnetic recording medium has become extremely minute, about several 10 nm. To obtain a reproducing output from such a minute recording bit, saturation magnetization and a film thickness as large as possible must be secured for each bit. However, the minute recording bit reduces a quantity of magnetization per bit, and there arises a problem that is loss of magnetization information due to magnetization reversal by "thermal fluctuation".

Generally, it is said that this "thermal fluctuation" has a larger effect as a value of $Ku \cdot V/kT$ (Ku: a magnetic anisotropy constant, V: a minimum unit volume of magnetization, k: Boltzman's constant, T: an absolute temperature) is smaller, and it is empirically said that magnetization reversal occurs because of "thermal fluctuation" at $Ku \cdot V/kT < 100$.

In the case of a magnetic recording medium of a longitudinal magnetic recording mode, since a demagnetization field becomes strong in a recording bit of a high recording density region, the medium tends to be affected by "thermal fluctuation" even while a magnetic particle size is relatively large. On the other hand, in the case of a magnetic recording medium of a perpendicular magnetic recording mode, since growth of a magnetic particle in a film thickness direction enlarges a minimum unit volume of magnetization V while keeping a particle size of a medium surface small, the effect of "thermal fluctuation" can be suppressed. However, if a density of the HDD is increased much more in the future, there may be a limit to resistance to thermal fluctuation even for the perpendicular magnetic recording mode.

As a method for solving the problem of the thermal fluctuation resistance, a magnetic recording medium called "patterned medium" attracts attention. The patterned medium generally means a magnetic recording medium in which a plurality of magnetic material regions to be recording bit units are independently formed in a nonmagnetic material layer. In a general patterned medium, for the nonmagnetic material layer, for example, an oxide such as $SiO_2$, $Al_2O_3$ or $TiO_2$, a nitride such as $Si_3N_4$, AlN or TiN, carbide such as TiC, and boride such as BN are used, and ferromagnetic material regions are selectively formed in these nonmagnetic material layers.

In the patterned medium, since the ferromagnetic material regions which are the recording bit units are independent of each other, interference between the respective recording bits can be prevented. Therefore, the patterned medium is advantageous for reducing recording loss and noises which are caused by adjacent bits. Moreover, patterning increases resistance of domain wall movement (pinning effect of domain wall), making it possible to improve magnetic properties.

On the other hand, in the case of the HDD, positioning of a magnetic head in a target position (target track) on the magnetic recording medium or moving speed is controlled based on servo information pre-recorded on the magnetic recording medium. Generally, the servo information is recorded in each of servo regions (servo sectors) radially provided at predetermined intervals in a circumferential direction on the magnetic recording medium.

Normally, writing of the servo information is carried out by using a servo writing device called a servo track writer. After assembling the magnetic recording medium and the magnetic head into a casing of a HDD main body, the servo information is written. However, as a recording density of the HDD becomes much higher, the quantity of the servo information is increased proportionately thereto. Then, an area of the servo region on the magnetic recording medium is consequently increased, reducing an area of an effective recording region (data region) in contradiction.

On the other hand, studies have recently been conducted on a magnetic recording medium structure of a "deep layer servo system" which has a servo region buried in a deep layer different from a magnetic recording layer. In this structure, since the recording region and the servo region can be formed by being laid on each other, a full surface of the magnetic recording medium can be used as the recording region, and the servo region can also be formed on the full surface of the magnetic recording medium. Thus, without sacrificing the recording region, the magnetic head is enabled to perform highly accurate tracking at any point on the disk.

To fabricate the above-described patterned medium, it is necessary to form fine magnetic material patterns in a large area. On the other hand, a magnetic random access memory (MRAM) has recently attracted attention as a new nonvolatile memory element. Manufacturing of the MRAM also necessitates highly integrated magnetic material patterning.

Conventionally, for such magnetic material patterning, the following four processes have mainly been employed: first, a process for forming a magnetic material thin film to be fabricated; second, a photolithography process for forming a resist film on the magnetic material thin film, and for forming a pattern on the resist film by using photon energy, electron beams, ion beams or the like; third, a process for etching the magnetic material thin film using the resist pattern as a mask; and fourth, a process for removing remaining resists or residuals left after the etching. Among the above processes, the thin film formation process, the photolithography process, and the residual removal process can use methods applied in semiconductor processes. However, since the magnetic material is hard to be etched unlike a general semiconductor material, it is difficult to use normal reactive ion etching (RIE) used in a semiconductor process. Instead, therefore, a physical etching method such as ion milling, in which field-accelerated ions sputter on a sample surface, has been used.

FIGS. 1A to 1E show a conventional method for manufacturing a patterned medium using ion beam milling. That is, as shown in FIG. 1A, a ferromagnetic material layer 520 containing Fe, Co, Ni or the like is first formed on a substrate 510 of Si or the like by using a sputtering method or the like. Then, on this ferromagnetic material layer 520, a resist pattern 530 corresponding to a desired pattern is formed by electron beam writing. Further, as shown in FIG. 1B, ion beam milling is carried out by using this resist pattern 530 as a mask, and an exposed portion of the ferromagnetic material layer 520 is subjected to etching. Then, as shown in FIG. 1C, a remaining resist film is removed. As shown in FIG. 1D, a nonmagnetic material layer 540 is coated to fill grooves formed by the ion milling. Lastly, by subjecting the substrate surface to chemical mechanical polishing (CMP), a patterned medium shown in FIG. 1E is obtained.

However, in the above-described conventional manufacturing method, since the ferromagnetic material layer 520 is fabricated using the ion beam milling, damage remains on a crystal structure of the fabricated surface. Thus, fabrication with no damage is desired to further improve magnetic properties.

In addition, as the etching by the ion milling is physical, there is almost no difference in etching rates due to a difference between materials to be etched. As the ferromagnetic material layer 520 and the resist pattern 530 are scraped at approximately the same rate, an aspect ratio of a shape that can be fabricated depends on a thickness of the resist pattern 530 as a mask. If there is about 20 nm difference in level between a surface of the resist pattern and the ferromagnetic material layer, a depth of 20 nm is a limit for a ferromagnetic material to be etched. Thus, to carry out fabrication of a good aspect ratio, a thin resist cannot be used.

In the case of the high recording density HDD, a surface of the magnetic recording medium must be smooth to reduce spacing between the magnetic recording medium and the magnetic head. Accordingly, as shown in FIG. 1E, the nonmagnetic material layer 540 is buried in concave portions of the etched ferromagnetic material layer 520, and then the substrate surface must be smoothed in a CMP step. This CMP step imposes a load on the process for forming the patterned medium.

On the other hand, a medium of a discrete tracking system (IEEE Transactions on Magnetics Vol. 25, No. 5, P3381, 1989) has recently been proposed as one type of a patterned medium. This patterned medium has a magnetic layer formed only in a track region. The magnetic layer is formed in a region between tracks using ion milling or the like. However, there is a level difference of 20 to 50 nm attributable to presence/non-presence of a magnetic layer on the medium surface, and the level difference causes a problem of considerably reducing seeking durability.

In order to solve the problem of the level difference on the medium surface, a medium of a discrete system has been proposed, in which a magnetic layer that needs to become a region between tracks is made nonmagnetic by implanting nitrogen ions or oxygen ions therein (Japanese Patent Laid-Open No. 5-205257(published in 1993)).

In addition, as a method for forming a patterned medium having a smoother surface, a method has been proposed for forming a patterned medium by selectively oxidizing a medium surface using a mask (U.S. Pat. No. 6,168,845).

In the above-described method of implanting oxygen ions or method of partially oxidizing the surface, since no etching steps are employed, the problem concerning the level difference on the surface due to ion milling does not occur.

However, these methods cannot completely remove the level difference on the medium surface. This is because a volume of the oxidized region made nonmagnetic is increased, and the medium surface of the oxidized region is raised.

In the case of using oxidation reaction, since a mask material having high resistance to oxidation should preferably be used, a normal resist removing step such as an $O_2$ ashing process cannot be used to remove the mask material. Consequently, the removing the mask material brings a process load.

Also, regarding the manufacturing of MRAM, necessary films including a lower ferromagnetic material layer, a tunnel oxide film layer, an upper ferromagnetic material layer, and the like are formed on a substrate, and then these layers are physically etched using ion milling when each memory element region is plotted. However, short-circuiting may occur between the upper and lower ferromagnetic material layers because of etching damage or etching residuals. Thus, it is desired to use a magnetic material patterning method having none of the above-described problems, high yields and good productivity.

On the other hand, the following problems exist concerning writing in the servo region formed in the magnetic recording medium. First, when a normal sample servo (sector servo) system is used, a step of writing servo information by using a conventional servo writer is necessary. Since head movement is controlled and the servo information is sequentially recorded in the respective servo regions of all tracks set on the magnetic recording medium, the step of writing servo tracking information is one of the steps that takes long time in the manufacturing process. In the future, a greater quantity of servo information will be necessary when a recording density is increased, requiring much longer time for the writing of the servo information by the servo writer. Thus, in order to mass-produce high recording density HDD devices inexpensively, it is required to shorten the time required for the step of writing servo information.

Furthermore, even in the case of the magnetic recording medium using the deep layer servo system, a step of forming a deep layer servo region is necessary in addition to the step of forming the magnetic recording medium. In the case of the deep layer servo system, especially, since writing of the servo information is carried out on the full surface, a time load for the writing is extremely large, and thus a request for shortening the time is stronger than that for the sample servo system.

Therefore, also for the writing of the servo information, instead of the method using the conventional servo track writer, it is desired to employ a magnetic material patterning method having high productivity and capable of writing servo information in the magnetic recording medium all at once.

BRIEF SUMMARY OF THE INVENTION

An object of the present invention is to provide a magnetic material patterning method applicable to manufacturing of various magnetic products, which causes no physical damage and has high productivity.

In order to achieve the above-described object, a first aspect of the present invention provides a method of patterning magnetic material including preparing a ferromagnetic material layer containing at least one element selected from the group consisting of Fe, Co and Ni, selectively masking a surface of the ferromagnetic material layer, exposing an exposed portion of the surface of the ferromagnetic material layer in halogen-containing active reaction gas or reaction liquid and converting the exposed portion and a lower layer thereof into a compound with a component in the reaction gas or the reaction liquid by chemical reaction to make the compound nonferromagnetic.

Here, "to make nonferromagnetic" means to lessen ferromagnetic characteristics, and specifically means to convert a ferromagnetic material into a nonmagnetic or paramagnetic material.

According to the first aspect invention, since the nonferromagnetic material layer is selectively formed by the chemical reaction between halogen and the ferromagnetic material layer, a magnetic pattern composed of ferromagnetic and nonferromagnetic material layers can be formed. Because of the use of the chemical reaction, no physical damage is incurred, and also a large region can be patterned in a batch process. The halogenated nonferromagnetic material region has little volume expansion different from the case of oxidation, and thus an extremely smooth surface can be obtained without a step of polishing the surface. Moreover, because of the use of halogenation reaction, a general resist can be used, and oxygen ashing process can be used for removing the resist. By using this magnetic material patterning, it is possible to manufacture patterned medium, to write servo information in a magnetic recording medium all at once, and to manufacture various magnetic products including a magnetic recording element such as an MRAM, and the like.

A second aspect of the present invention provides a magnetic recording medium including a plurality of recording regions made of ferromagnetic materials, each containing at least one element selected from the group consisting of Fe, Co and Ni, and a nonferromagnetic material region for separating the recording regions from each other, the region being a compound of the foregoing ferromagnetic material and halogen.

According to the second aspect, a patterned medium is provided by the recording region made of the ferromagnetic material and the nonferromagnetic material region made of the halogen compound of this ferromagnetic material. Since this nonferromagnetic material region is formed by the chemical method, the recording region is not damaged. Accordingly, manufacturing conditions cause no deterioration of magnetic properties, and good magnetic properties can be obtained. In addition, the surface of the nonferromagnetic material region and the recording region is not uneven, and a magnetic recording medium having high substrate smoothness can be provided.

A third aspect of the present invention provides a magnetic recording medium including a plurality of recording regions made of ferromagnetic materials, each containing at least one element selected from the group consisting of Fe, Co and Ni, and a servo layer for separating the recording regions from each other, the servo layer having a nonferromagnetic material region which is a compound of the foregoing ferromagnetic material and halogen.

According to the third aspect, since servo information to be written in the servo 11 layer of the magnetic recording medium is written based on a pattern of presence/non-presence of a halogen compound layer which can be formed by chemical reaction. Therefore the servo information can be written in a large area all at once. Moreover, if the servo information is written based on the presence/non-presence of the halogen compound layer, since volume expansion of the halogen compound layer is very small, a magnetic recording medium having excellent smoothness of a substrate surface can be provided.

A fourth aspect of the present invention provides a magnetic random access memory including; a lower electrode layer formed on a surface of a substrate; a first ferromagnetic material layer made of a first ferromagnetic material containing at least one element selected from the group consisting of Fe, Co and Ni, the first ferromagnetic material layer being formed on the foregoing lower electrode layer; a tunnel insulating layer formed on the first ferromagnetic material layer; a second ferromagnetic material layer made of a second ferromagnetic material containing at least one element selected from the group consisting of Fe, Co and Ni, the second ferromagnetic material layer being formed on the tunnel insulating layer; and an insulating layer surrounding the foregoing first ferromagnetic material layer, tunnel insulating layer, and second ferromagnetic material layer, and containing a compound layer of the foregoing first ferromagnetic material and halogen, and a compound layer of the second ferromagnetic material layer and halogen.

According to the fourth aspect, the insulating layer surrounding the first ferromagnetic material layer, the tunnel insulating layer, and the second ferromagnetic material layer is formed of a halogen compound layer. Therefore element formation can be carried out by employing a magnetic material patterning method using halogenation reaction accompanied with no etching. Thus, no leakage due to etching is incurred, and an MRAM having high integration can be provided in a large-area batch process.

DETAILED DESCRIPTION OF THE EMBODIMENTS

Description will be made of the embodiments of the present invention with reference to the accompanying drawings.

FIRST EMBODIMENT

Figure 1A:
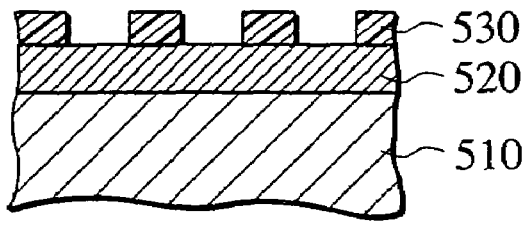
FIGS. 1A to 1E are process views showing a conventional patterned medium fabrication method using ion milling.
Figure 1B:
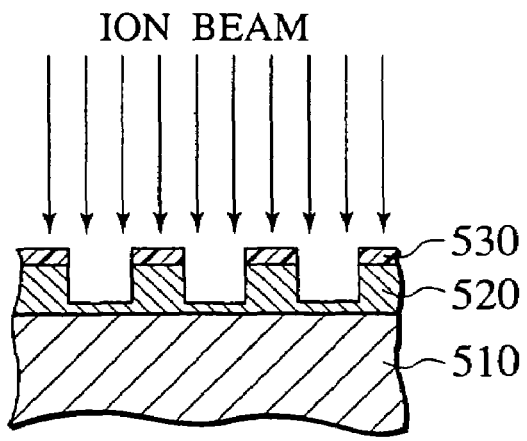
Figure 1C:
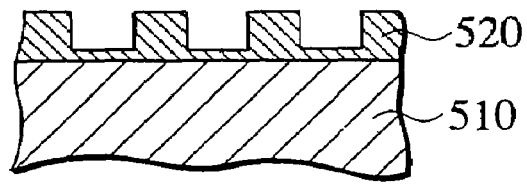
Figure 1D:
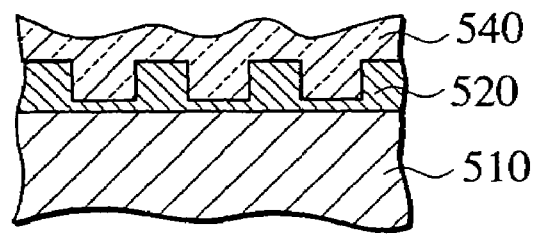
Figure 1E:
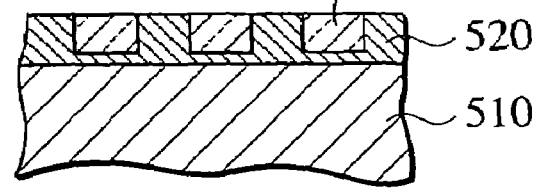
Figure 2A:
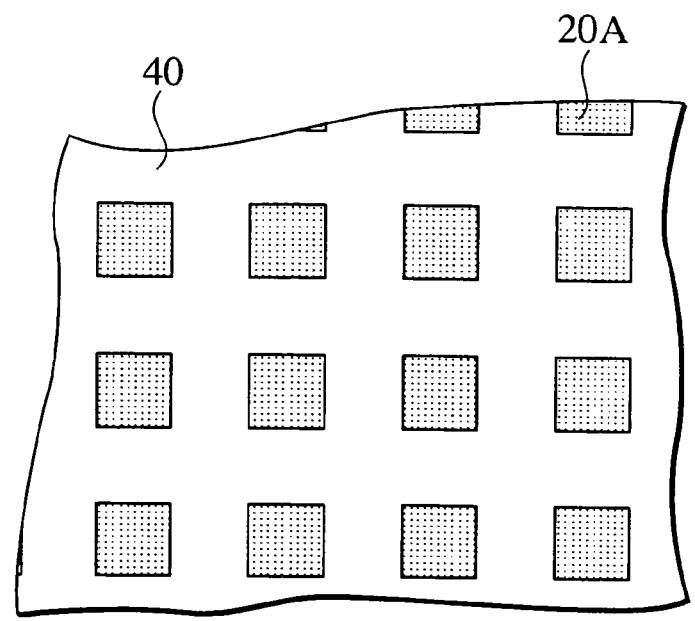
FIGS. 2A and 2B are partial plan and perspective views showing patterned media according to a first embodiment of the present invention.
Figure 2B:
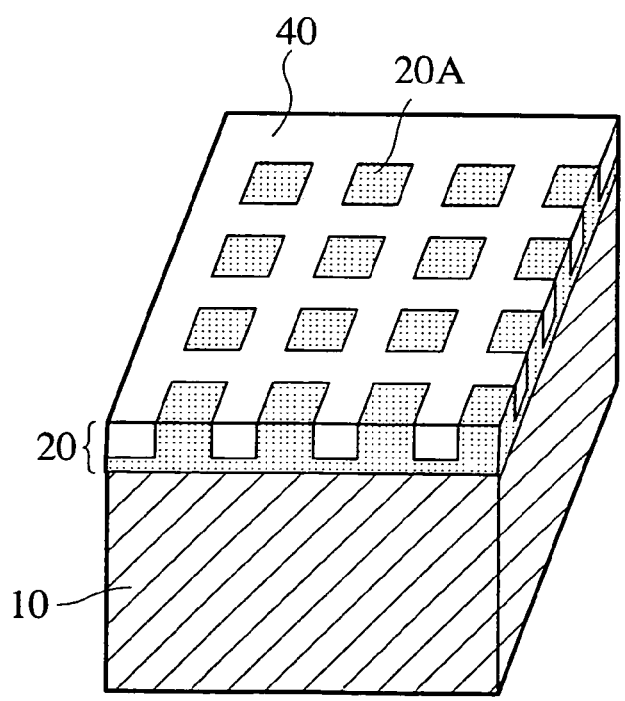

FIG. 2A is a partial plan view showing a structure of a magnetic recording medium according to a first embodiment of the present invention; and FIG. 2B is a perspective view of the same.

The magnetic recording medium of the first embodiment of the present invention is a so-called patterned medium. As shown in FIGS. 2A and 2B, this magnetic recording medium includes a recording layer 20 on a substrate 10. The recording layer 20 includes a ferromagnetic material region 20A and a nonferromagnetic material region 40. The ferromagnetic material region 20A contains any of Fe, Co and Ni, and has dotted exposed portions. The nonferromagnetic material region 40 surrounds at least an upper layer portion of the ferromagnetic material region 20A. Substantial recording regions are separated from each other by the nonferromagnetic material region 40. Here, the nonferromagnetic region means a region having lost magnetism at least as a ferromagnetic material, and exhibiting nonmagnetic, diamagnetic or paramagnetic properties.

The nonferromagnetic material region 40 is obtained by making nonferromagnetic using chemically reacting a layer containing the same component as that of the ferromagnetic material region 20A with active reaction gas. The composition of the nonferromagnetic material region 40 is common to that of the ferromagnetic material region 20A, i.e. containing one of Fe, Co and Ni.

According to such a magnetic recording medium of the first embodiment, since an etching step such as ion milling needed in the conventional patterned medium fabrication process is not necessary, and a CMP step can be omitted, it is possible to greatly simplify a process. Moreover, since damage accompanied by the step of ion milling or the like can be eliminated, it is possible to improve magnetic properties.

Next, the structure of the magnetic recording medium of the first embodiment and its manufacturing method will be described more in detail.

As shown in FIG. 2A, the ferromagnetic material regions 20A are regularly disposed at constant intervals on the surface of the magnetic recording medium, and the nonferromagnetic material region 40 is formed to surround the ferromagnetic material regions. Each ferromagnetic material region 20A constitutes 1 recording bit as a recording unit. Preferably, each ferromagnetic material region 20A should be completely independent. However, as shown in FIG. 2B, it is satisfactory that at least an upper layer portion of the ferromagnetic material region 20A is surrounded by the nonferromagnetic material region 40. Accordingly, recording regions are substantially separated from each other. The ferromagnetic material regions 20A should be set to 100 nm square or smaller, preferably 80 nm square or smaller, in such a manner as to set a single magnetic domain state where respective directions of magnetization thereof are aligned in one direction. The shape of the ferromagnetic material regions 20A are not limited to a rectangle, but various shapes can be employed, for example, a circle, an elliptical shape and the like.

For a recording system of the ferromagnetic material region 20A, both longitudinal and perpendicular recording systems can be employed. To achieve a high recording density, however, the perpendicular recording system is preferable.

The ferromagnetic material region 20A contains one of the elements Fe, Ni and Co, which are ferromagnetic materials, in its composition. For example, the ferromagnetic material region is composed of a crystal material of Ni—Fe or Fe—Al—Si: a Co-base amorphous material of Co—Zr—Nb; an Fe-containing microcrystal material of Fe—Ta—N; Fe; Co; Fe—Co; Co—Cr; Ba ferrite; and the like. Among these, preferably, alloy of CoPt, CoCrPt, FeCo, FePd, FePt or the like having large perpendicular magnetic anisotropy, or a material such as Co/Pd, or Co/Pt multilayer film should be used for formation of the ferromagnetic material region.

The nonferromagnetic material region 40 is obtained by halogenating a layer having an identical composition to that of the above-described ferromagnetic material region 20A. For example, as halogenated materials, $CoF_2$, $CoF_3$, $FeF_2$, $FeF_3$, and $NiF_2$ can be cited. These are all antiferromagnetic materials, but exhibit paramagnetism at room temperature except for $CoF_3$ and $FeF_3$, because of low Neel temperature (Tn).

Figure 3A:
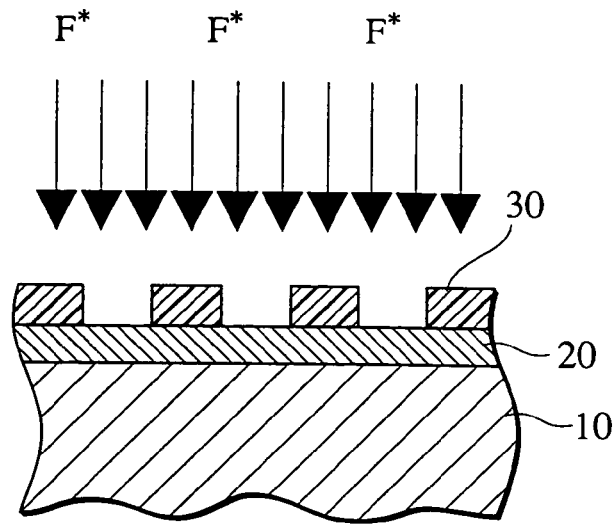
FIGS. 3A to 3C are process views showing a manufacturing method of the patterned medium of the first embodiment of the present invention.
Figure 3B:
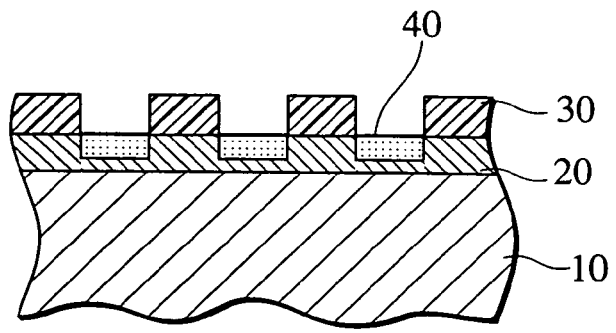
Figure 3C:
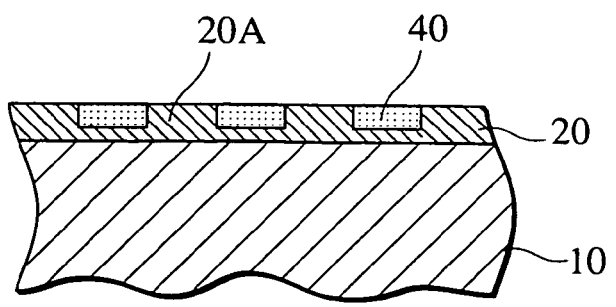

FIGS. 3A to 3C are process views showing a manufacturing method of the magnetic recording medium of the embodiment.

First, as shown in FIG. 3A, a ferromagnetic material layer 20 is formed in a film thickness of, for example about 10 nm to 50 nm, on a substrate 10 of Si or the like by a sputtering method or the like. Then, resist 30 is coated on the ferromagnetic material layer 20 by a spin coater or the like. There is no particular limitation on a film thickness of the resist 30. The resist 30 may have a thickness to cover a surface of the ferromagnetic material layer 20 without any pinholes. The resist 30 is selectively exposed by using EB writing system or the like, and through a developing step, a resist pattern corresponding to a plane pattern of FIG. 2A is formed. That is, a surface of a portion to be left as the ferromagnetic material region is covered with the resist 30, and other portions are exposed. Then, the substrate obtained after the resist patterning are exposed to active reaction gas containing halogen.

For the reaction gas containing halogen, for example, gas such as $CF_4$, $CHF_3$, $CH_2F_2$, $C_2F_6$, $C_4F_8$, $SF_6$, $Cl_2$, $CCl_2F_2$, $CF_3I$ or $C_2F_4$ can be used.

The active reaction gas is preferably active radical. Various methods are available for generating radicals. For example, a existing plasma CVD apparatus or a dry etching apparatus can be used. When reaction gas is introduced into a chamber of such an apparatus and a high-frequency voltage is applied, field-accelerated electrons collide with the reaction gas, the reaction gas is separated and radicals, which are chemically extremely active, are generated. A substrate temperature may be set at normal temperature; however, to increase a reaction speed more, heating may be applied within a range not affecting magnetism of the ferromagnetic material region.

A suitable example of a plasma generation apparatus is, for example, an inductive coupled plasma (ICP) apparatus. The ICP apparatus includes a Platen RF having a function of inducting plasma to the substrate side, which is provided separately from a Coil RF mainly having a function of generating plasma. These portions can be separately set for output thereof. For example, by setting the Coil RF to 300 W and the Platen RF to 0 W, high density plasma, which is suitable for producing radical reaction, is generated. An effect of sputtering can be suppressed to a minimum since no damage is given to the medium surface. To prevent sputtering the medium surface, a pressure in a reaction chamber should be set slightly high, e.g., 10 to 30 mtorr, more preferably about 20 mtorr. In the case of using $CF_4$ as reaction gas, a gas flow rate should be set in a range of 10 to 50 sccm, preferably about 20 sccm.

For example, as shown in FIG. 3A, when the ferromagnetic material layer 20 not covered with the resist 30 is exposed to active fluorine (F) radicals generated from $CF_4$ gas, the exposed surface of the ferromagnetic material layer 20 is gradually halogenated in a depth direction by the F radicals.

Thus, as shown in FIG. 3B, the halogenated region becomes a halide layer, and becomes a nonferromagnetic material region 40 which has lost magnetism. On the other hand, the region having its surface covered with the resist 30 becomes a ferromagnetic material region 20A. A depth of the nonferromagnetic material region 40 should preferably be set approximately equal to a depth of the ferromagnetic material layer 20. However, such equality of depth is not always necessary, and with respect to a thickness of the ferromagnetic material layer 20, for example, the depth of the nonferromagnetic material region 40 is set to ½ of the ferromagnetic material layer 20 or more, more preferably ⅔ thereof or more.

Note that a dry process is not always necessary, and a similar result can be obtained by a wet process. For example, $CoCl_3$ or the like may be halogenated by using a HCl solution.

Lastly, by removing the remaining resist 30, a patterned medium shown in each of FIG. 3C and FIGS. 2A and 2B can be obtained. For the removal of the resist, ashing process using oxygen plasma can be employed.

According to the manufacturing method of the above-described first embodiment, it is possible to obtain a patterned medium in which the recording region of the ferromagnetic material layer 20A is surrounded with the nonferromagnetic material region 40 which is halogenated metal. For example, since Neel temperatures (Tn) of CoF2 and NiF2 which are the nonferromagnetic material region 40 obtained by halogenation reaction are very low, respectively 38K and 73K. Thus, as CoF2 and NiF2 surely exhibit paramagnetism at room temperature, no mutual magnetic operation occurs between adjacent recording bits, and adjacent magnetic recording is isolated. Therefore, this manufacturing method using halogenation reaction is suitable for manufacturing the patterned medium.

On the other hand, for CoO and NiO obtained by oxidation reaction, which are the nonferromagnetic material regions of the discrete medium and the patterned medium disclosed in Japanese Patent Laid-Open No. 5-205157 (published in 1993) and U.S. Pat. No. 6,169,845 already described above, magnetic phase transition temperatures (Tn) are respectively 291K and 548K. Thus, oxidized metal generated by oxidation reaction exhibits antiferromagnetism at room temperature. In the case of a medium including a ferromagnetic material buried in a diamagnetic material, a ferromagnetic material layer is magnetically not completely isolated, and thus magnetic recording of an adjacent recording bit may be adversely affected. For example, when identical signals are recorded in adjacent bits, there is a high possibility that magnetization reversal will extinguish a stored content.

Therefore, the patterned medium having the nonmagnetic material region obtained by the halogenation reaction according to the first embodiment can acquire better magnetic properties compared with the patterned medium having the nonmagnetic material region obtained by the oxidation reaction.

Generally, since a halide, especially a fluoride has strong ion crystallization as represented by $CaF_2$ (fluorite), it is easy to obtain a crystal of good orientation. The crystal is unlikely to be dissolved in water, and is chemically stable. When a fluoride and an oxide of the same metal are compared with each other, bond dissociation energy (D) of the fluoride is generally larger. For example, D of $MgF_2$ is 511.7 kJ/mol, and D of MgO is 336.8 kJ/mol. Thus, the fluoride can be expected to exhibit higher stability than the oxide.

Moreover, the good orientation of the fluoride may realize a uniform particle size of the adjacent ferromagnetic material regions 20A, and thus an effect of more improvement in the magnetic properties of the ferromagnetic material region can be expected.

In addition, CoO which is an oxide is tetragonal where a lattice constant of a c axis is 4.124. However, since a lattice constant of a c axis of a fluoride $CoF_2$ is small, i.e., 3.180, there is almost little volume expansion such as that in the oxidation reaction occurs. Therefore, unevenness due to the presence of a halogenated region does not generated, providing extremely good smoothness.

According to the manufacturing method of the above-described first embodiment, since the surface of the ferromagnetic material layer 20 is not etched, surface heights of the nonferromagnetic material region 40 and the ferromagnetic material region 20A are approximately equal to each other, making it possible to approximately maintain smooth surfaces of reaction starting time. Thus, unlike the conventional case of fabricating a patterned medium by using ion milling, a step of smoothing a surface by CMP is not necessary in the last step of the process. Therefore, it is possible to greatly shorten the manufacturing process.

In addition, in the case of using ion milling, an influence of damage caused by the ion milling remains in a fabricated surface layer of the ferromagnetic material region, for example its sidewall. However, according to the method of the above-described first embodiment, the ferromagnetic material region 20A is not damaged. Thus, characteristic deterioration caused by the process is unlikely to occur in the ferromagnetic material region 20A.

Moreover, in the above-described conventional patterning method using the oxidation reaction, since metal such as Ti having high resistance to oxidation or an inorganic film such as $SiO_2$ is mainly used as a mask, a RIE process must be executed to remove such a mask after oxidation reaction. During this RIE process, the medium surface may be partially damaged by sputtering. On the other hand, in the method of patterning a magnetic material according to the first embodiment, since the halogenation reaction is used, a general resist mask can be used. The resist can be easily removed by oxygen ashing process which can reduce the damage to the medium surface to a minimum.

Moreover, according to the manufacturing method of the above-described first embodiment, because the shape of the ferromagnetic material region 20A is not dependent on a resist film thickness, the resist film thickness can be reduced. Thus, for example, it is possible to use a thin resist pattern having a dot thickness of about 20 nm utilizing a self-organization phenomenon (phase separation phenomenon) of a diblock copolymer. A block copolymer means a copolymer composed of a linear polymer including a plurality of homopolymers as constituent components. Especially one obtained by chemically coupling two kinds of polymers is called a diblock copolymer. For example, for such a resist material, a diblock copolymer composed of polystyrene (PS) and polymethyl methacrylate (PMMA) generally used for an optical disk substrate or the like can be used.

By controlling a composition ratio and a molecular weight of the block copolymer, various structures can be easily formed. For example, when a solution in which polystyrene (PS) and polymethyl methacrylate (PMMA) are mixed is coated on the ferromagnetic material layer 20, a sea-island (Sphore) structure can be obtained, which is phase-separated into an "island" region of PMMA and a "sea" region of PS. By exposing this sea-island structure to ozone and by selectively vaporizing PMMA therein, dot patterns each having a regular PMMA thickness of 20 nm and a diameter less than 40 nm can be obtained. That is, dot patterns of a size suited for formation of a patterned medium can be formed all at once.

In the conventional method of using the ion beam milling, use of the above-described thin resist is difficult. However, according to the method of the first embodiment using the chemical method, such thin resist can be used as an etching mask. If patterned resist is obtained by utilizing the self-organization phenomenon of the diblock copolymer, the patterning of the resist by EB writing system which takes long time is made unnecessary. Thus, the method of the embodiment becomes very effective means for simplifying the process.

As described above, according to the magnetic recording medium of the first embodiment, in addition to excellent resistance to thermal fluctuation and the effect of preventing crosstalk and partial erasing from an adjacent bit, which the patterned medium structure itself has, it is possible to improve magnetic properties by reducing damage received in the manufacturing process, and to shorten the process.

Hereinafter, description will be made for examples of examination that the inventors made in order to verify the effect of the patterned medium of the first embodiment.

EXAMPLE 1

Figure 4A:
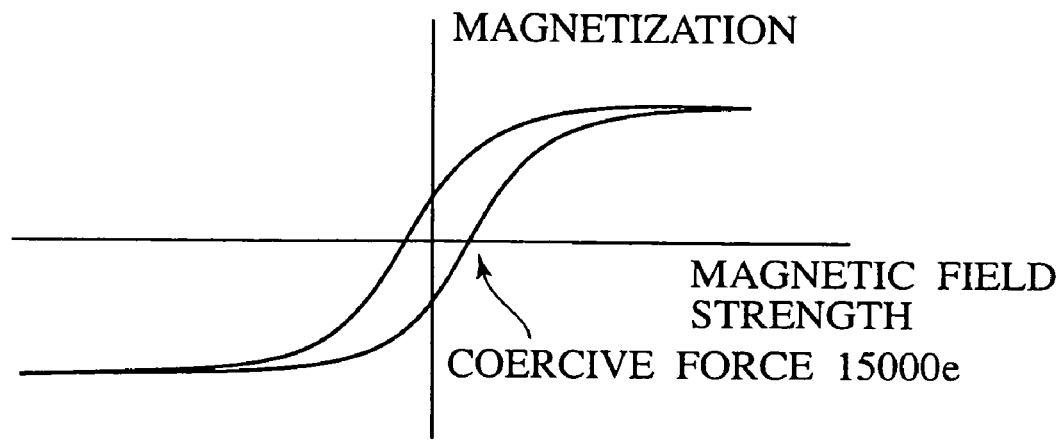
FIGS. 4A and 4B are views showing VSM data regarding a ferromagnetic material layer and a nonferromagnetic material layer according to an example 1 of the first embodiment of the present invention.

First, CoPt was deposited by 20 nm on a Si substrate by a sputtering method, and a magnetic force microscope (MFM) image on a surface of this sample was observed. An image of a perpendicular magnetic recording medium having a high-contrast maze pattern which is a typical ferromagnetic pattern was observed. A hysteresis curve in a perpendicular direction was measured by a vibrating sample magnetometer (VSM), and a curve, as shown in FIG. 4A, which has a squareness ratio of 0.49 and a coercive force of 1500 Oe was obtained.

Then, a composition of the sample surface was analyzed by using X-ray photoelectron spectroscopy (XPS). A peak inherent in Co was observed at binding energy=778 eV. A peak (781 eV) of CoO was simultaneously observed; however, this peak was due to natural oxidation of oxygen in the atmosphere. Two peaks inherent in Pt were also observed within the range from 70 to 75 eV.

Subsequently, CoPt was deposited by 20 nm on the Si substrate by the sputtering method. This sample was placed in a sealed chamber, plasma was generated in the chamber, and $CF_4$ gas was introduced to generate F radicals. Then, a surface of the sample was exposed to the F radicals for about 30 seconds. A sample temperature in this event was set to room temperature.

Then, when a composition of the sample surface was analyzed by using XPS, both peaks 778 eV (Co) and 781 eV (CoO) disappeared, and a new peak (cobalt fluoride) of 783 eV was observed. No peak shifting was observed at a Pt peak. This shows that exposure to the F radicals surely converted the surface into cobalt fluoride.

In addition, when the composition of the sample surface was analyzed by using scanning Auger electron spectroscopy (AES), conversion of CoPt into cobalt fluoride was verified. By observing changes of peaks of the cobalt fluoride with passage of time while sputtering, it was found out that the cobalt fluoride existed from a medium surface to a depth of about 10 nm. It was also verified that it was possible to covert all 20 nm which is a thickness of CoPt into a halide by extending the exposure time of the F radicals.

When a MFM image of the sample surface was also observed, a typical MFM image seen when magnetization disappeared was observed.

Figure 4B:
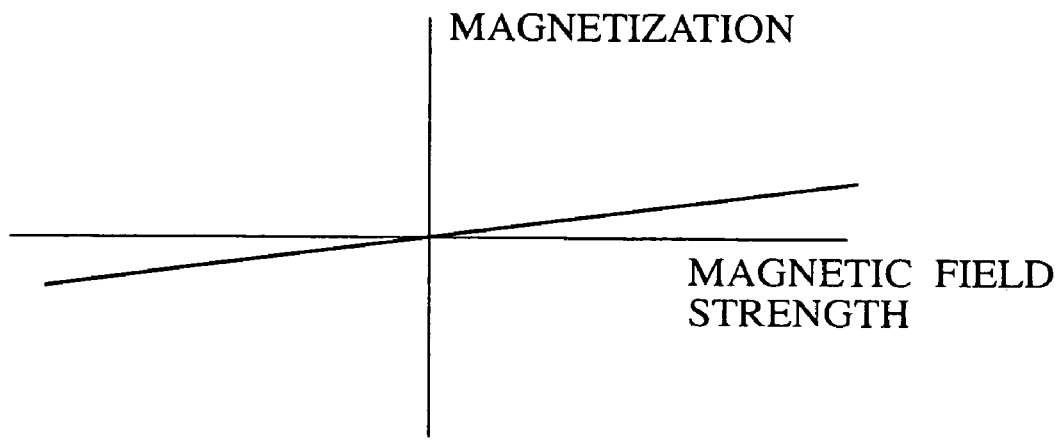

By observing this sample with VSM, data of a typical paramagnetic material as shown in FIG. 4B was obtained. This is attributed to the fact that $CoF_2$ is originally an antiferromagnetic material, but behaves like a paramagnetic material at room temperature because of an extremely low Neel temperature.

As a result, it was verified that the CoPt film which is a ferromagnetic material layer was converted into a halide within a short time by being exposed to the F radicals, and that magnetism thereof disappeared.

EXAMPLE 2

Figure 5A:
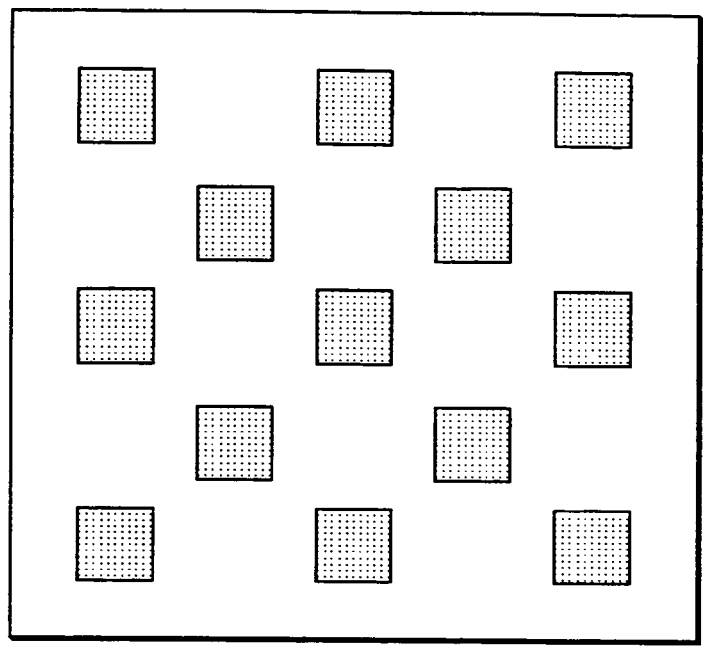
FIGS. 5A and 5B are views showing a pattern of a resist mask according to an example 2 of the first embodiment of the present invention, and showing an electrophotograph of MFM image regarding an actually obtained patterned medium.

A patterned medium sample, in which ferromagnetic material CoPt regions are surrounded by antiferromagnetic material $CoF_2$, was prepared. That is, first, CoPt was deposited by 20 nm on a Si substrate by a sputtering method. Then, resist was coated in a thickness of about 1.0 μm on this CoPt film by spin coating, and a resist pattern as shown in FIG. 5A was formed after batch exposure and development. In this example, a size of each ferromagnetic material region on a surface layer was set to 2.0 μm square.

A surface of this sample was exposed in F radicals generated under conditions similar to those of the example 1 for about 30 seconds while being maintained at room temperature. Then, the resist was removed by using an oxygen ashing apparatus.

Figure 5B:
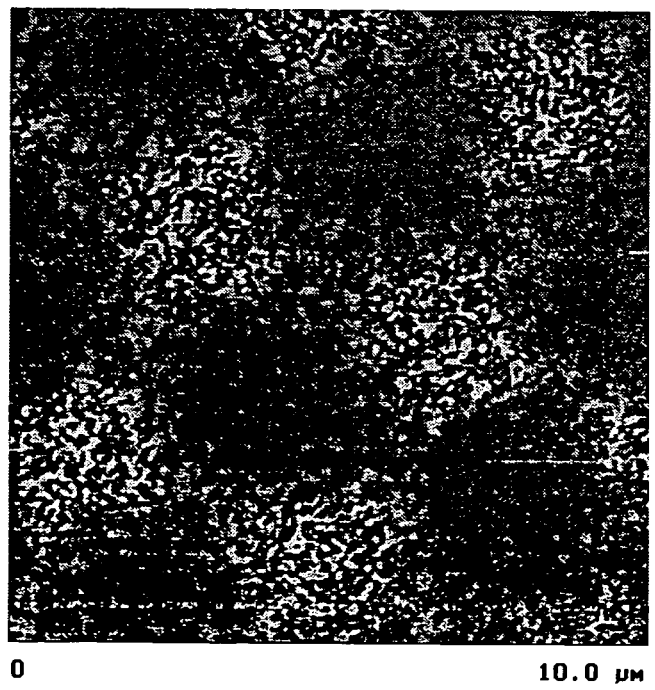

When a MFM image of this sample was observed, a magnetic pattern equivalent to a resist pattern as shown in FIG. 5B was obtained. That is, regarding a region covered with a resist film., a MFM image of a ferromagnetic material having typical perpendicular magnetic anisotropy was observed. In a region where a CoPt surface was exposed, a typical MFM image seen when magnetization disappeared was observed.

Moreover, when the region where the CoPt surface was exposed was analyzed by using XPS, conversion of CoPt into a halide was verified. Identification of a composition was carried out by using XPS, however, verification can be carried out by using a surface analyzer such as AES or secondary ionization mass spectrometry (SIMS).

The sample thus obtained was a uniformly continuous thin film having no unevenness on its surface. In addition, magnetically, as shown in FIG. 2A or FIG. 2B, the sample was verified to be a patterned medium where ferromagnetic material regions 20A isolated at least on a surface layer were regularly arrayed in a nonferromagnetic material region 40.

EXAMPLE 3

In order to form finer patterns of the ferromagnetic material region than that of the above-described example 2, electron beam (EB) writing was carried out in exposure of resist. Accordingly, fine ferromagnetic material region patterns of about 80 nm square were formed. Other conditions were the same as those of the above example 2, and by using these conditions, a sample was prepared. That is, CoPt was deposited by 20 nm on a Si substrate by sputtering. Then, nega-resist was coated thereon, a minute resist pattern was formed by EB writing, and exposure thereof in F radicals was carried out for about 30 seconds at room temperature. Thereafter, the resist was removed.

An obtained sample was observed by MFM, and a single color image was obtained in a ferromagnetic material region. That is, it was verified that by reducing the ferromagnetic material region to a size of about 80 nm square, a single magnetic domain state was set in this region. When magnetic properties in a perpendicular direction were observed by VSM, a squareness ratio of 1.00 and a coercive force of 4500 Oe were obtained. These values represent a squareness ratio twice as large and a coercive force three times as large compared with the VSM curve of the CoPt film not exposed in the F radicals after sputtering in the example 1, and improvement in the magnetic properties was observed. It was also verified that in a comparative example 1 to be described later, better magnetic properties were obtained compared with a patterned medium of an equal size fabricated by the conventional method.

EXAMPLE 4

CoPt was deposited by 30 nm on a Si substrate by sputtering. Then, the resultant structure was left under oxygen atmosphere for one day to oxidize a CoPt surface. When the surface was observed by XPS, a peak (781 eV) of CoO was verified.

Subsequently, resist was coated in a thickness of about 1.0 μm on the CoPt film by spin coating, and after batch exposure and development, a plurality of rectangular resist patterns of 2.0 μm square as shown in FIG. 5A were formed.

A surface of this sample was exposed in F radicals generated under similar conditions to those of the example 1 for about 30 seconds while being maintained at room temperature. Then, the resist was removed by using an oxygen ashing apparatus.

When a MFM image of this sample was observed, a magnetic pattern equivalent to a resist pattern as shown in FIG. 5B was obtained. That is, regarding a region covered with the resist film, a MFM image of a ferromagnetic material having typical perpendicular magnetic anisotropy was observed. In a region where a CoPt surface was exopsed, a typical MFM image seen when magnetization disappeared was observed. In a simultaneously observed surface leveling image (similar to AFM surface topological image), almost unevenness is not observed.

In addition, the region where the CoPt surface was exposed was analyzed by using XPS, conversion of CoPt into a halide was verified.

As a result, it was found out that even when a reacting surface was naturally oxidized beforehand, a halide layer could be obtained by later substitution reaction of a fluorine radical. It was also verified that this method enabled formation of a patterned medium having almost flat medium surface.

COMPARATIVE EXAMPLE 1

As a comparative example, a sample was prepared according to a conventional manufacturing method of a general patterned medium. That is, CoPt was deposited by 20 nm on a Si substrate by a sputtering method. Then, nega-resist was coated on a surface thereof, and by EB writing, a pattern equivalent to a ferromagnetic material region of 80 nm square was formed similarly to the example 3. Subsequently, a surface of the sample was uniformly etched by Ar ion beam milling. When CoPt of a region not covered with the resist was etched by about 20 nm, the remaining resist was removed by $O_2$ ashing. Then, $SiO_2$ was deposited by 20 nm by sputtering, and the surface was covered so as to fill a CoPt groove portion formed by ion milling. In addition, the surface was polished by CMP processing. Accordingly, a patterned medium in which CoPt ferromagnetic material regions of about 80 nm square, which are independent of one another, are surrounded with $SiO_2$ was obtained. That is, the prepared sample was equivalent to one where the halide portion of the sample prepared in the example 3 was changed to $SiO_2$.

When a CoPt portion was observed by MFM, an image was approximately the same as the magnetic image of the example 2 having the size of the ferromagnetic material region set to 2 μm square. When magnetic properties in a perpendicular direction were observed by VSM, a squareness ratio of 0.70 and a coercive force of 2000 Oe were obtained. These values represented improvement in magnetic properties compared with those of the CoPt continuous film not exposed to the F radicals immediately after sputtering in the example 1. However, compared with the patterned medium having the ferromagnetic material region of the same size as the example 3, the magnetic properties were inferior.

(Result)

By comparing the comparative example with the example 3, it was verified that the manufacturing process of the patterned medium of the example 3 was not only simple, but also the magnetic properties of the ferromagnetic material region thereof were improved compared with those of the patterned medium of the comparative example.

One of the reasons may be as follows. That is, in the case of the sample of the comparative example, since fabrication is carried out by using the ion beam milling, the fabricated surface of the ferromagnetic material region was at least damaged. On the other hand, in the case of the sample of the example 3, since the chemical method accompanied with no physical damage is used, there is no damage on the surface of the ferromagnetic material.

In addition, in the case of the patterned medium of the example 3, CoPt is converted into a halide to form the nonferromagnetic material region. However, the halide is an ionic crystal, and is not amorphous such as $SiO_2$ forming the nonferromagnetic material region of the patterned medium of the comparative example. Thus, it can be conceived that good orientation of the ionic crystal realizes a uniform CoPt particle size of the adjacent ferromagnetic material regions, improving magnetic properties more.

Moreover, from the result of the example 4, it was verified that when halogenation reaction was used for formation of the nonmagnetic material region, surface smoothness required for the HDD medium, i.e., a difference in level of 0.8 nm or lower, was sufficiently obtained.

SECOND EMBODIMENT

Figure 6:
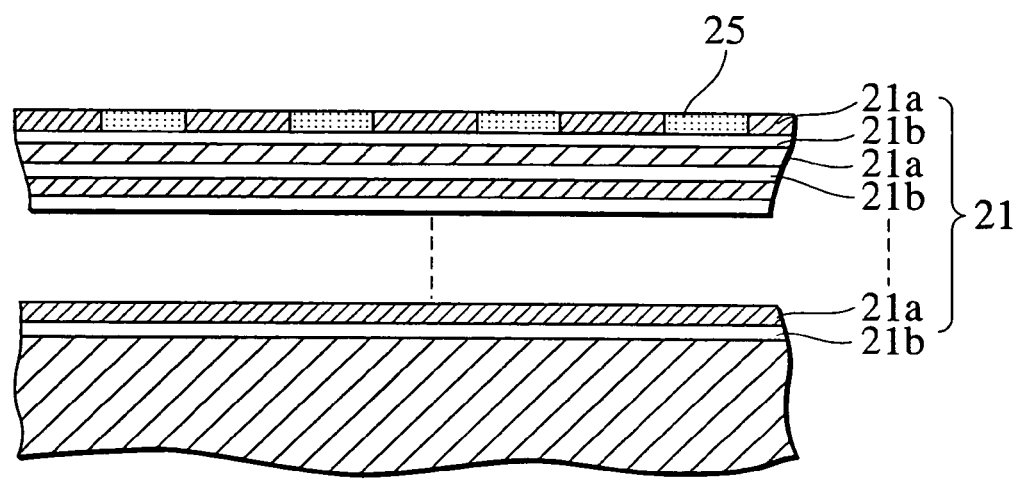
FIG. 6 is a sectional view showing a structure of a patterned medium using a multilayer film according to a second embodiment of the present invention.

FIG. 6 is a sectional view showing a structure of a patterned medium according to a second embodiment.

Also in the patterned medium of the second embodiment, a method for forming a nonferromagnetic material region uses the similar chemical method as that described in the first embodiment. A difference from the first embodiment is that a multilayer film is formed instead of the ferromagnetic material thin film formed on the Si substrate. The multilayer film includes a plurality of layers, e.g., ferromagnetic and metal layers, alternately laminated in a regular manner. For example, a multilayer film obtained by alternately laminating Co and Pt or Co and Pd is known. By using such a multilayer film a high coercive force can be obtained. Other constitutions and manufacturing methods are common to those of the first embodiment.

In order to form the patterned medium of the second embodiment, first, as shown in FIG. 6, a multilayer film 21 alternately laminating Co layers 21a and Pt layers 21b is formed on a substrate 10 by a sputtering method or the like. For example, a film thickness of the Co layer 21a should be set in a range from 0.2 nm to 1.0 nm, preferably 0.5 nm. A film thickness of the Pt layer 21b should be set in a range from 0.5 nm to 2.0 nm, preferably 1.0 to 2.0 nm. The number of the respective layers is about 10; the number of the Pt layers is larger than that of the Co layers by one layer.

The process thereafter is basically similar to that of the first embodiment. Resist is coated on the multilayer film 21, the resist is selectively exposed by using EB writing or the like and is developed, then a resist pattern equivalent to a portion to be left as a ferromagnetic material region is formed. Subsequently, a surface of the multilayer film 21 having the resist pattern formed thereon is exposed in active reaction gas or in a reaction liquid.

For example, when the surface of the multilayer film 21 having the resist pattern formed thereon is exposed to F radicals, the F radicals halogenate the exposed surface of the multilayer film 21 to form a halide region 25.

For an artificial lattice, a regularly laminated structure, especially its interface, is important. Accordingly, if even one layer of the laminated structure is physically damaged or a chemical composition thereof is changed, magnetism in upper and lower laminated portions is lost. Thus, as shown in FIG. 6, the halide region 25 may be formed only on a limited surface layer film of the multilayer film 21.

Thereafter, by removing the remaining resist, as in the case shown in FIG. 2A, a patterned medium including a ferromagnetic material region 20A made of the multilayer film and a nonferromagnetic material region 40 surrounding the ferromagnetic material region 20A can be obtained.

As described above, in the conventional method using the ion beam milling, since the fabricated surface of the ferromagnetic material region is damaged, it is difficult to form a patterned medium using a multiplayer film, in which even small damage affects magnetic properties. However, by using the method of the second embodiment, the patterned medium using the multilayer film can be fabricated easily.

Also in this case, as described above in the first embodiment, a thin resist film can be used. Thus, instead of resist patterning carried out by using EB writing, it is possible to use a resist patterning method using a self-organization phenomenon of a diblock copolymer.

Hereinafter, description will be made for examples of examination that the inventors made in order to verify an effect of the patterned medium using the multilayer film of the second embodiment.

EXAMPLE 5

First, Co films in a thickness of 4.4 nm and Pt films in a thickness of 9.5 were alternately laminated to form ten layers on a Si substrate by a sputtering method, thus forming a multilayer film In this state, MFM was observed, and a magnetic pattern inherent in a ferromagnetic material having perpendicular magnetic anisotropy was identified. In addition, when magnetic properties in a perpendicular direction were observed by VSM, a squareness ratio of 0.8 and a coercive force of 2000 Oe were obtained.

Subsequently, resist was coated in a thickness of 1.0 µm on the multilayer film and a fine ferromagnetic material region pattern of about 80 nm square was formed by EB writing. Under conditions similar to those of the example 1, this multilayer film with the resist pattern was exposed to F radicals for about 30 seconds at room temperature, and a surface of an exposed portion was halogenated. Then, the remaining resist was removed.

Observation was made for a MFM image of a sample thus obtained, and presence of a ferromagnetic material region and a nonferromagnetic material region at a high contrast ratio was verified. This contrast ratio was higher than that obtained in the example 3. For the ferromagnetic material region, it was also verified that a single color image was formed, and a single magnetic domain was formed. For this portion, magnetic properties in a perpendicular direction were observed, and a squareness ratio of 1.00 and a coercive force of 5000 Oe were obtained.

It was thus verified that when a patterned medium using such a multilayer film was formed, an S/N ration higher than that in the case of using a single CoPt layer film was obtained.

EXAMPLE 6

Under conditions similar to those of the example 5, a multilayer film was formed on a substrate. On the multilayer film a solution of PS-PMMA diblock copolymer was coated, and a sea-island structure which is phase-separated into an "island" region of PS and a "sea" region of PMMA was formed. This sea-island structure was exposed in ozone, PMMA was selectively vaporized, and dot patterns of PS were formed in a thickness of about 20 nm and a diameter of about 40 nm.

Subsequently, this sample was exposed to F radicals at room temperature for about 30 seconds, and a surface of the exposed portion was halogenated. Then, the remaining PS was removed.

A MFM image of the obtained sample was observed, and it was verified that a region covered with PS formed a ferromagnetic material region of a single magnetic domain, and regions other than the above region became nonferromagnetic material regions.

As described above, it was verified that according to the method of the embodiment, it was possible to fabricate a patterned medium having a fine ferromagnetic region by employing a resist pattern using the self-organization phenomenon of the diblock copolymer with a level difference of only 20 nm.

In other words, instead of EB writing which takes long time, by using a patterning method of resist using phase separation of a diblock copolymer, it is possible to greatly shorten a resist patterning process.

THIRD EMBODIMENT

A third embodiment relates to writing of servo information in a servo region on a magnetic recording medium. The magnetic material patterning method using the halogenation reaction described in the first embodiment can be used not only for forming a patterned medium but also for writing servo information in the servo region all at once.

Figure 7A:
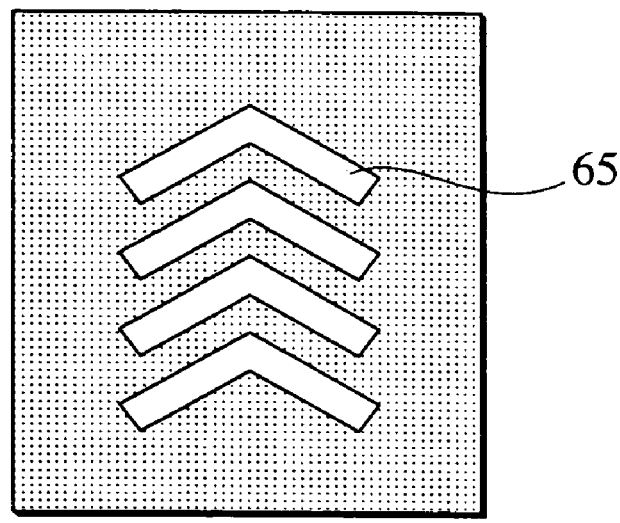
FIGS. 7A and 7B are plan views showing pattern examples of servo information.
Figure 7B:
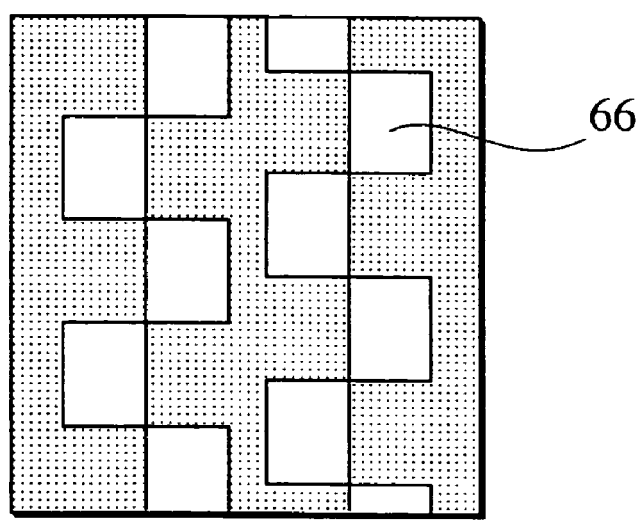

That is, in the magnetic recording medium of the third embodiment, resist is coated on a surface of a recording layer having a ferromagnetic material layer formed thereon, and an opening pattern equivalent to a servo signal pattern is formed in a portion to be a servo region. As the servo signal pattern, one generally used may be used. For example, formed is one as shown in FIG. 7A in which a plurality of wedge-shaped patterns 65 are arrayed, or one as shown in FIG. 7B in which patterns 66 alternately formed left and right are arrayed in two rows by being shifted up and down by half pitches.

After the resist pattern is formed, under conditions similar to those of the first embodiment, the magnetic recording medium is exposed in active reaction gas, for example F radicals. A ferromagnetic material layer of the opening portion of the resist pattern is halogenated to be changed to a nonferromagnetic material region. By removing the resist, a magnetic pattern equivalent to the resist pattern can be formed in the servo region on the magnetic recording medium.

As long as the magnetic pattern formed in the servo region can be verified as magnetic information, it is not a problem that which one of inner and outer sides of the pattern should be set as a ferromagnetic material region or as a nonferromagnetic material region.

By using the above method to write the servo information, writing operations in the respective regions can be carried out in a batch process. Thus, it is possible to greatly shorten time necessary for writing of the servo information.

Moreover, the method of writing servo information according to the third embodiment can also be applied to writing servo information of a magnetic recording medium of a continuous servo system, which is capable of always taking out a servo signal in any position of a magnetic head on a disk. As the magnetic recording medium of the continuous servo system, for example, a magnetic recording medium is disclosed in Japanese Patent Laid-Open No. 2000-19200 (published in 2000). This magnetic recording medium includes servo patterns located adjacently to both sides of a recording track, which are formed on a full surface of the magnetic recording medium. In the Japanese Patent Laid-Open No. 2000-19200, pre-formatting using a photolithography process and a thin film forming process is only disclosed, and specific servo pattern forming method is not taught. However, by a method similar to the patterned medium forming method of the first embodiment, a servo pattern used for the continuous servo system can be formed.

Figure 8:
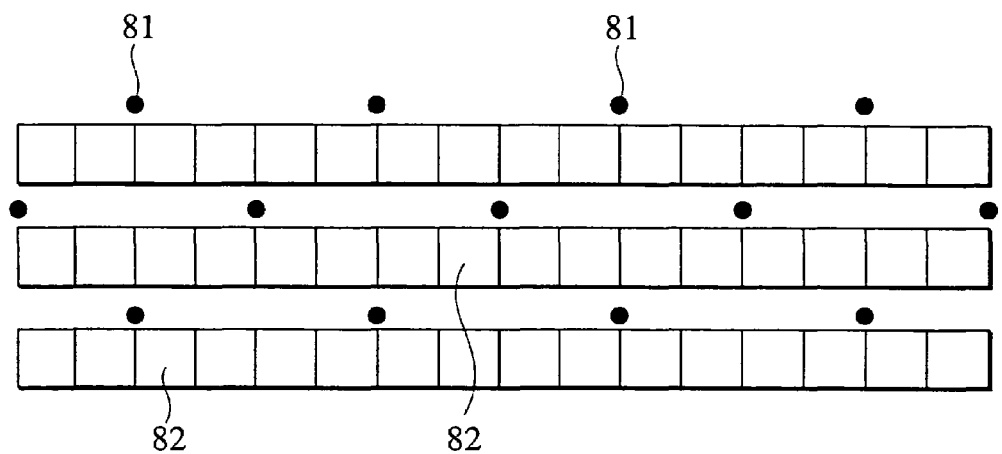
FIG. 8 is a plan view showing a pattern example of a magnetic recording medium surface of a continuous servo system.

FIG. 8 shows an example of a servo pattern formed in a medium of such a continuous servo system. As shown in FIG. 8, servo patterns 81 are periodically disposed in both sides of each recording track 82 where a recording region is formed, the patterns being shifted by a half period. A shape of the servo pattern 81 is not limited to a dot shown in the drawing, but may be a rectangular or long-axis pattern.

The dot patterns 81 regularly disposed in both sides of the recording track 82 can be patterned by using regular dot resist patterns formed by utilizing the above-described self-organization phenomenon (phase separation phenomenon) of the diblock copolymer. In such a case, since extremely fine patterns can be formed all at once on a full surface of the recording medium without using EB writing or the like, it is possible to greatly simplify the process, facilitating the formation of the magnetic recording medium of the continuous servo system.

There is no particular limitation on the recording system and structure of the recording layer of the recording medium of the third embodiment. A recording layer of a normal longitudinal recording system, or a recoding layer of a perpendicular recording system may be employed. In addition, a continuous film of a single layer, an multilayer film or a patterned medium as described in each of the first and second embodiments may be employed. When a patterned medium is formed, writing of servo information can be carried out simultaneously with the formation of the patterned medium.

Hereinafter, description will be made for examples of the third embodiment, which are made by the inventors.

EXAMPLE 7

A sample was prepared under conditions similar to those of the example 2, except for formation of a resist pattern equivalent to the wedge-shaped opening pattern 65 shown in FIG. 7A. That is, CoPt was deposited by 20 nm on a Si substrate by a sputtering method. Then, resist was coated in a thickness of about 1.0 μm on the CoPt film by spin coating, and through batch exposure and development, a wedge-shaped opening pattern shown in FIG. 7A was formed. Subsequently, a surface of the sample was exposed in F radicals for about 30 seconds while being maintained at room temperature. Then, the resist was removed by using an oxygen ashing apparatus.

By XPS, it was verified that only CoPt of the opening portion of the resist exposed to the F radicals was chemically changed to an antiferromagnetic material ($CoF_2$). Also, when observation was made by MFM, a magnetic image of a wedge-shaped pattern equivalent to a resist pattern was obtained.

As a result, it was verified that by using the magnetic material patterning method of the third embodiment, it was possible to write servo information, i.e., tracking servo information in a large area all at once.

EXAMPLE 8

A sample having the servo pattern 81, shown in FIG. 8, changed to a rectangular shape was prepared. The sample was prepared under conditions similar to those of the example 2, except for formation of an opening pattern corresponding to the servo pattern, by using resist. That is, CoPt was deposited by 20 nm on a Si substrate by a sputtering method. Then, resist was coated in a thickness of about 1.0 μm on the CoPt film by spin coating, and through batch exposure and development, a rectangular opening pattern was formed. Subsequently, a surface of the sample was exposed in F radicals for about 30 seconds, while being maintained at room temperature. Then, the resist was removed by using an oxygen ashing apparatus.

By XPS, it was verified that only CoPt of the opening portion of the resist exposed to the F radicals was chemically changed to $CoF_2$. Also, when observation was made by MFM, a magnetic image of a rectangular pattern equivalent to the resist pattern was obtained.

As a result, is was verified that by using the magnetic material patterning method of the third embodiment, it was possible to write servo information, i.e., tracking servo information in a large area all at once.

FOURTH EMBODIMENT

A fourth embodiment relates to a structure of a magnetic recording medium of a deep layer servo system, and a manufacturing method thereof.

Figure 9:
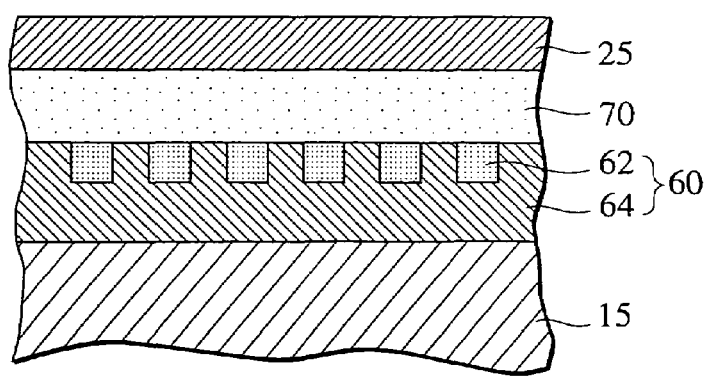
FIG. 9 is a sectional view showing a structure of a magnetic recording medium having a deep layer servo structure according to a fourth embodiment of the present invention.

FIG. 9 shows the structure of the magnetic recording medium that is the deep layer servo system of the fourth embodiment.

A ferromagnetic material layer 64 is formed on a substrate 15, and a nonferromagnetic material region 62 having a servo information pattern is formed on a surface layer of the ferromagnetic material layer 64. A servo layer 60 is composed of the ferromagnetic material layer 64 and the nonferromagnetic material region 62. On the servo layer 60, a ferromagnetic material layer 25 as a recording layer is formed with a nonmagnetic material layer 70 interposed therebetween.

FIGS. 10A to 10E are process views showing the manufacturing method of the magnetic recording medium of the fourth embodiment.

Figure 10A:
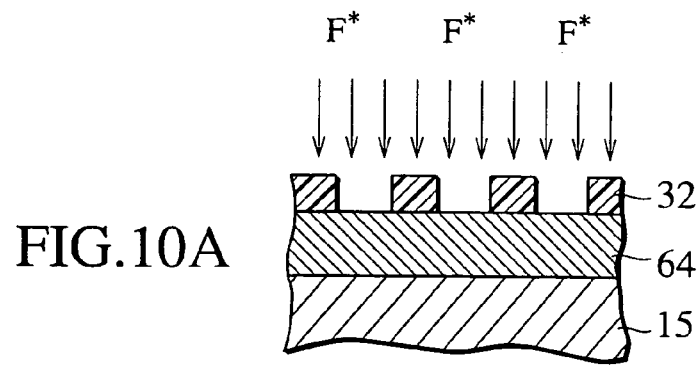
FIGS. 10A to 10E are process views showing a manufacturing method of the magnetic recording medium having the deep layer servo structure of the fourth embodiment of the present invention.

A servo layer is basically formed by using the same chemical method as that for the fabrication method of the patterned medium of the first embodiment. That is, first, as shown in FIG. 10A, the ferromagnetic material layer 64 is formed on the substrate 15 by using a sputtering method or the like. For this ferromagnetic material layer 64, various ferromagnetic materials containing Co, Ni, Fe can be used similarly to the case of the ferromagnetic material layer 20 of the first embodiment. Also, a multilayer film as described above in the second embodiment may be formed.

Then, a resist film is coated on the ferromagnetic material layer 64, and through batch exposure and development, on the ferromagnetic material layer 64, a resist pattern 32 equivalent to servo information is formed on a full surface of the substrate. There is no particular limitation placed on the resist pattern 32, and for example, a general servo information pattern as shown in FIG. 7A or FIG. 7B may be used. Then, under conditions similar to those of the first embodiment, a surface of the substrate is exposed to active reaction gas or reaction liquid, for example F radicals.

Figure 10B:
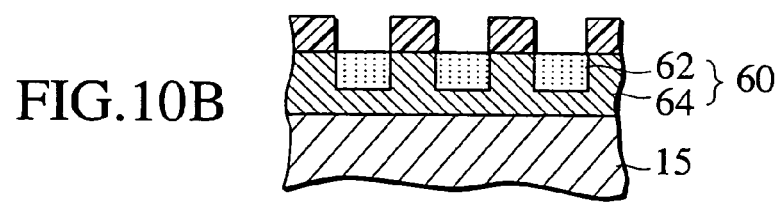

As shown in FIG. 10B, the ferromagnetic material layer 64 of a region exposed to the F radicals loses magnetism to be changed to a nonferromagnetic material region 62. The nonferromagnetic material region 62 needs not be so deep as long as a magnetic pattern as servo information can be formed.

Figure 10C:
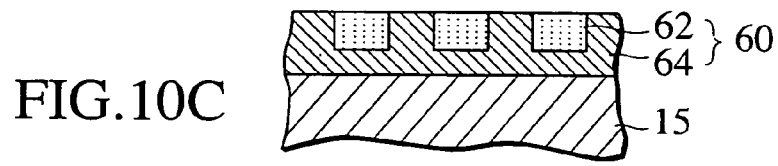
Figure 10D:
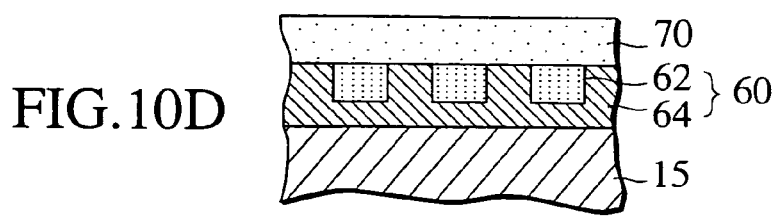

As shown in FIG. 10C, after the remaining resist is removed, a nonmagnetic layer 70 is formed on the substrate surface by using a CVD method or the like as shown in FIG. 10D. For this nonmagnetic layer 70, an oxide such as $SiO_2$, $Al_2O_3$ or $TiO_2$, a nitride such as $Si_3N_4$, AlN, TiN or BN, or carbide such as TiC may be used.

Figure 10E:
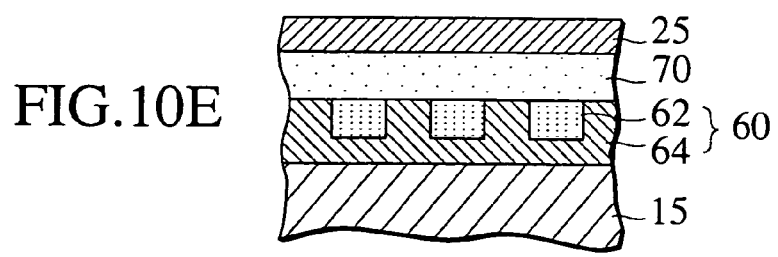

Further, as shown in FIG. 10E, a ferromagnetic material layer 25 is formed on the nonmagnetic layer 70. There is no particular limitation placed on a material and a structure of this ferromagnetic material layer 25. A continuous single layer may be used or a patterned medium as described in the first embodiment may be formed. Alternatively, an multilayer film as described in the second embodiment may be formed. In addition, the ferromagnetic material layer 25 may be set as a recording layer of a normal longitudinal recording system or as a recording layer of a perpendicular recording system. Thus, the magnetic recording medium with the deep layer servo system is obtained.

In the magnetic recording medium with the deep layer servo system, since servo information is written in the servo layer 60 independent of the recording layer 25, the servo information can be written on a full surface of the servo layer 60. Accordingly, positioning control can be carried out with high accuracy. On the other hand, the quantity of servo information to be written is greatly increased. However, by using the manufacturing method of the above-described fourth embodiment, since servo information can be written all at once, it is possible to greatly shorten the manufacturing process.

Hereinafter, description will be made for examples of the fourth embodiment, which are made by the inventors.

EXAMPLE 9

A deep layer servo region was formed by using a method similar to that of the example 7. That is, CoPt was deposited by about 20 nm on a substrate by a sputtering method. Then, a resist film was coated in a thickness of about 1.0 μm on the CoPt film, and through batch exposure and development, an opening pattern equivalent to the wedge-shaped servo pattern shown in FIG. 7A was formed in the resist film. Subsequently, a surface of the sample was exposed in F radicals for about 30 seconds while being maintained at room temperature. Then, the resist was removed by using an oxygen ashing apparatus.

Then, SiO2 was deposited by 500 nm on the servo layer by a sputtering method, and CoPt to be a recording layer was further deposited by 50 nm by a sputtering method. Accordingly, a magnetic recording medium having a deep layer servo structure was obtained.

FIFTH EMBODIMENT

A fifth embodiment relates to a magnetic recording device (HDD: hard disk drive) equipped with the magnetic recording medium of one of the above-described first to fourth embodiments.

Figure 11:
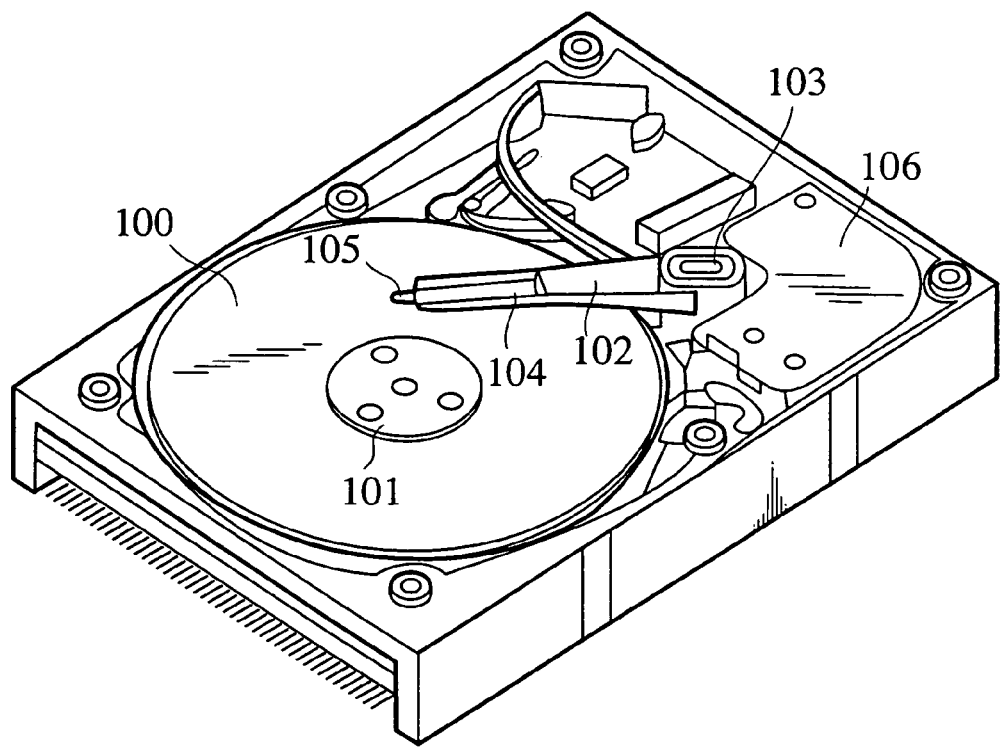
FIG. 11 is a device perspective view showing a structure example of a hard disk drive according to a fifth embodiment of the present invention.

FIG. 11 is a perspective view showing an example of a structure of a HDD according to the fifth embodiment. As shown in FIG. 11, a magnetic recording medium 100 is mounted on a spindle 101, and rotated by a not-shown motor. An actuator arm 102 attached to a fixed shaft 103 has a suspension 104 in its tip, and a head slider 105 is provided in a tip of this suspension 104.

In a base end of the actuator arm 102, a voice coil motor 106 as a type of a linear motor is provided. This voice coil motor 106 includes a magnetic circuit which is composed of a not-shown driving coil wound up on a bobbin portion of the actuator arm 102, and a permanent magnet and an opposite yoke which are disposed oppositely so as to each other to sandwich the coil.

A not-shown recording/reproducing head is formed in a tip of the head slider 105. By rotation of a disk, the head slider 105 is floated by keeping a fixed distance with the magnetic recording medium 100, and the recording/reproducing head is moved relatively to the magnetic recording medium 100. In recording, information is recorded in the magnetic recording medium 100 by a magnetic field generated from the recording head. In reproducing information, by scanning of the reproducing head on the magnetic recording medium, information is reproduced by a leakage magnetic field from each bit on the magnetic recording medium.

Figure 12:
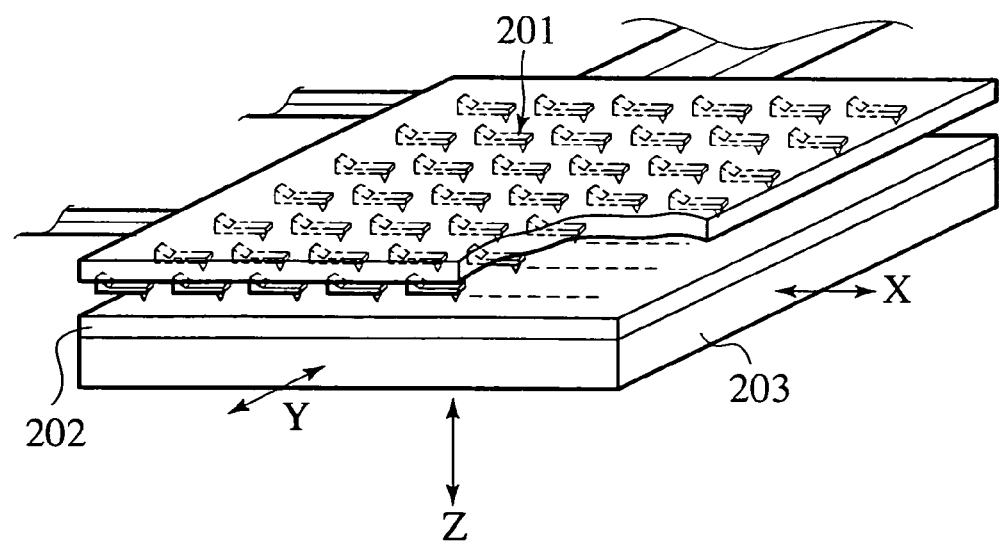
FIG. 12 is a device perspective view showing a structure of another hard disk drive according to the fifth embodiment of the present invention.

FIG. 12 is a perspective view showing a structure of another HDD of the embodiment. In the case of the above-described HDD shown in FIG. 11, the magnetic recording medium is rotated, and recording/reproducing is carried out by the floating type magnetic head. However, when a recording density of the magnetic recording medium becomes much higher, an influence of shaft vibration along with the rotation of the recording medium cannot be ignored. On the other hand, in the case of the HDD shown in FIG. 12, no shaft vibration problem occurs because rotary driving is not used.

A magnetic recording medium 202 is loaded on a stage 203 which can be driven in X, Y and Z directions. A head portion 201 including a plurality of magnetic heads is disposed oppositely to the magnetic recording medium. The head portion 201 is fixed, and the magnetic recording medium 202 is moved relatively to the head portion 201 by driving of the stage 203 using a piezo element. Since no rotary-driving is carried out, the magnetic recording medium needs not be disk-shaped, and a rectangular-shape one or the like can be used as shown in the drawing.

The head portion 201 includes the plurality of heads disposed in a multi-array form, and by simultaneously recording/reproducing a plurality of information, it is possible to execute high-speed and large-capacity data recording/reproducing. No particular limitation is placed on the number of heads.

There is no particular limitation on a method of recording information in the magnetic recording medium. A method of writing by a leakage magnetic field from the head, a method of writing by a magnetic field formed by a current flowing due to charge injection by a needle-shaped probe, and the like may be used.

There is also no particular limitation on a method of reproducing information of the magnetic recording medium. A method of detecting a leakage magnetic field of the magnetic recording medium, a method of detecting spinning of a tunnel current of the recording medium, and the like may be used.

If the above-described HDD is equipped with the patterned medium of the first or the second embodiment, a device which is high in a SN ratio, large in capacity and low in manufacturing costs can be provided. Moreover, if the HDD is equipped with the magnetic recording medium of the third or the fourth embodiment, manufacturing costs can be reduced by shortening the time of writing servo information. Especially, if the magnetic recording medium of the deep layer servo system of the fourth embodiment is used, a large storage capacity and highly accurate positioning control can be provided.

SIXTH EMBODIMENT

A sixth embodiment relates to patterning of a magnetic material other than a magnetic recording medium, especially to patterning of a magnetic random access memory (MRAM).

The magnetic material patterning method of each of the above-described first to fourth embodiments can be used for fabricating various magnetic products which require patterning of magnetic materials other than the magnetic recording medium, the products being, for example, an MRAM, a motor, a magnetic sensor, a magnetic switch and the like. Conventionally, in the manufacturing methods of these magnetic products physical etching such as ion milling has mainly been used for fabricating a hard magnetic material layer. If a method of changing an unnecessary magnetic material region to a nonmagnetic material by using halogenation reaction is used instead, property deterioration of the magnetic material layer, caused by physical damage, can be prevented.

Especially, in the manufacturing method of the MRAM where integration and mass production are required, an advantage obtained by applying the magnetic material patterning method of each of the first to fourth embodiments is large. The MRAM is one obtained by applying a technology of magnetic tunnel junction to a random access memory, and has a magnetic tunnel junction element structure composed of two ferromagnetic material layers and a thin insulating layer sandwitched therebetween. Compared with a conventional DRAM, the MRAM is more advantageous in that the MRAM can be used as a nonvolatile memory and has a high access speed. High integration is necessary for securing a large memory capacity, and in a manufacturing process thereof, microfabrication and simplification of the process are required.

Figure 13A:
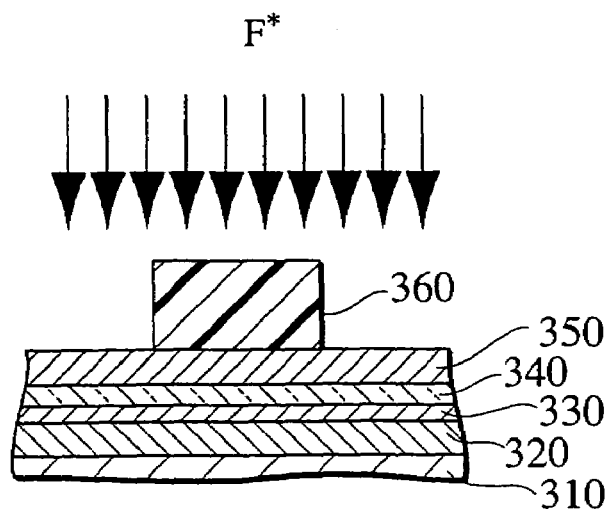
FIGS. 13A to 13C are process views showing a manufacturing method of a MRAM according to a sixth embodiment of the present invention.
Figure 13B:
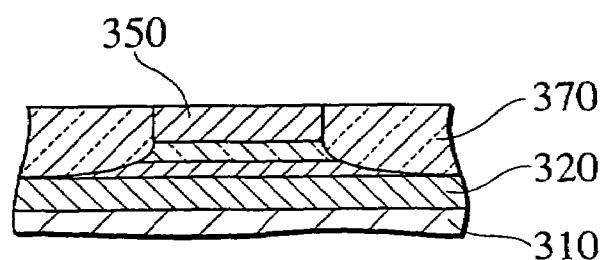
Figure 13C:
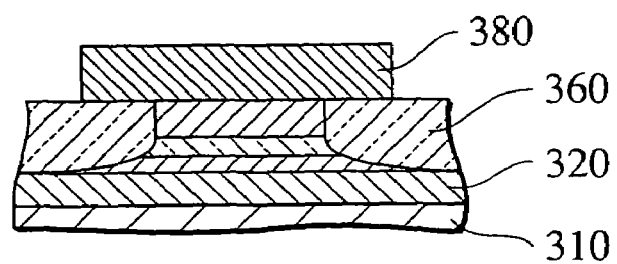

FIGS. 13A to 13C show an MRAM patterning process of the sixth embodiment. Here, only one memory element is shown; however, in an actual product, similar memory elements are arrayed on the same substrate in a matrix form.

First, as shown in FIG. 13A, on a Si substrate 310 having, for example, a thermal oxide film formed thereon, a buffer layer 320, a lower ferromagnetic material layer 330, a tunnel oxide layer 340, and an upper ferromagnetic material layer 350 are sequentially laminated. A pattern of resist 360 is further formed on the laminated surface. A plurality of buffer layers and an electrode layer may be provided between the Si substrate 310 and the lower ferromagnetic material layer 320. In addition, for the lower and upper ferromagnetic material layers 330 and 350, as described in the first embodiment, various ferromagnetic materials containing any of elements Fe, Ni and Co, in composition, can be used.

A surface layer is exposed in active reaction gas containing halogen gas such as fluorine radicals under conditions similar to those of the first embodiment. Then, the remaining resist is removed by oxygen ashing. As shown in FIG. 13B, a region not covered with a mask of the resist 360 is halogenated from the upper ferromagnetic material layer 350 to the lower ferromagnetic material layer 330, and then changed to a halide 370 as a nonferromagnetic insulating layer.

Then, by using a normal semiconductor process to form a pattern of an upper electrode layer 380 on a recording region layer, a MRAM structure shown in FIG. 13C is obtained.

By using the patterning method of the sixth embodiment, it is possible to separate the respective memory element regions including the upper ferromagnetic material layer 350, the tunnel oxide layer 340 and the lower electrode layer 330 by a chemical method without etching step.

If fabrication is carried out by physical etching using the conventional ion milling method, depending on an incident angle of Ar ions, short-circuiting often occurs in the side wall of the upper ferromagnetic material layer 350, the tunnel oxide layer 340 and the lower electrode layer 330 constituting junction. Because there are articles reattached on a surface by milling. However, by using the magnetic material patterning method of the sixth embodiment, not only damage caused by the physical etching, but also short-circuiting or the like between the upper and lower ferromagnetic material layers 330 and 350, caused by residuals after the etching, can be prevented.

In addition, since the halogenation reaction is used, resist which can be subjected to oxygen ashing can be used. If a self-organization resist such as a diblock copolymer is used as the resist, fine patterns can be formed in a large area all at once. Thus, higher integration can be achieved more easily.

Also, magnetic tunnel junction which can be applied to a reproducing magnetic head or the like can be provided by using a similar magnetic material patterning method.

Hereinafter, description will be made for an example of the sixth embodiment, which is made by the inventors.

EXAMPLE 10

Referring again to FIGS. 13A to 13C, description will be made for a magnetic material patterning method of an example 10 of the sixth embodiment.

First, as a buffer layer 320, an NiFe film was formed in a thickness of about 20 nm on a Si substrate 310 having a thermal oxide film by a sputtering method. Subsequently, on the buffer layer 320, a Co film having a thickness of about 4 nm as a lower ferromagnetic material layer 330. $Al_2O_3$ having a thickness of about 1 nm as a tunnel oxide layer, and a Co film having a thickness of about 10 nm as an upper ferromagnetic material layer 350 were sequentially laminated; Then, resist was coated in a thickness of about 1 μm on a surface of the upper ferromagnetic material layer 350 by spin coating, and through batch exposure and development, a square resist mask pattern of 5.0 μm×5.0 μm was formed.

By using an ICP apparatus, the substrate was exposed in generated F radicals for about 3 minutes. An exposed region not covered with the resist mask was analyzed by using AES, and presence of $CoF_2$ was verified. As a result of measuring a change with passage of time in a peak of $CoF_2$ while sputtering, presence of $CoF_2$ up to a depth of 15 nm from the surface was verified. In other words, conversion of all junction portions (Co:4 nm/$Al_2O_3$:1 nm/Co:10 nm) into halides was verified.

Subsequently, the resist was removed by $O_2$ ashing, and then a Cu film was formed in a thickness of about 300 nm as an upper electrode layer 380. For patterning, a metal mask was used.

In order to investigate whether or not short-circuiting occurs in the side face of junction, resistance values before and after fabrication were measured. When values standardizing the respective resistance values with a junction portion area were $R_0$ and $R_1$, $R_1/R_0=1$ was established. Based on the above result, occurrence of no short-circuiting was verified. In addition, the prepared sample showed R (resistance value)=$1.7\times10^6$ Ω, and MR=10%.

The MRAM fabricated in the above-described manner exhibited a resistance value and an MR ratio approximately equal to those of the MRAM fabricated by the normal ion milling, indicating that the magnetic material patterning method of the sixth embodiment was also effective as the MRAM fabrication method.

The description has been hereinbefore made for the magnetic recording medium and its manufacturing method of the present invention according to the respective embodiments. However, it should be understood that the present invention is not limited to the embodiments described above. Modifications and variations of the embodiments described above will occur to those skilled in the art, in light of the above teaching.

What is claimed is:

1. A magnetic storage medium comprising:
   a substrate;
   a plurality of recording regions formed on the substrate and made of ferromagnetic materials, each containing at least one element selected from the group consisting of Fe, Co and Ni; and
   a nonferromagnetic material region made of a compound of the ferromagnetic material and halogen, the nonferromagnetic material region is adjacent to the recording regions and separates the recording regions from each other.

2. The magnetic storage medium of claim 1, wherein the halogen is fluorine.

3. The magnetic storage medium of claim 2, wherein the compound is a cobalt fluoride.

4. A magnetic storage medium comprising:
   a servo layer comprising; a substrate: a plurality of recording regions formed on the substrate and made of ferromagnetic materials, each containing at least one element selected from the group consisting of Fe, Co and Ni; and a nonferromagnetic material region made of a compound of the ferromagnetic material and halogen, the nonferromagnetic material region is adjacent to the recording regions and separates the recording regions from each other.

5. The magnetic storage medium of claim 4, further comprising:
   a nonmagnetic material layer formed on the servo layer; and
   a recording layer formed on the nonmagnetic material layer.

6. The magnetic storage medium of claim 4, wherein the halogen is fluorine.

7. The magnetic storage medium of claim 6, wherein the compound is a cobalt fluoride.

* * * * *